(12) United States Patent
Ogi et al.

(10) Patent No.: US 8,497,543 B2
(45) Date of Patent: Jul. 30, 2013

(54) SEMICONDUCTOR MEMORY DEVICE AND METHOD FOR MANUFACTURING SAME

(75) Inventors: Jun Ogi, Kanagawa-ken (JP); Takeshi Kamigaichi, Kanagawa-ken (JP); Tatsuo Izumi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/234,260

(22) Filed: Sep. 16, 2011

(65) Prior Publication Data
US 2012/0241910 A1    Sep. 27, 2012

(30) Foreign Application Priority Data

Mar. 22, 2011    (JP) ................... 2011-062754

(51) Int. Cl.
*H01L 29/76*    (2006.01)
(52) U.S. Cl.
USPC ........... 257/314; 257/315; 257/316; 257/508; 257/522; 438/619; 438/623
(58) Field of Classification Search
USPC ............... 257/314–316, 522, 508, E29.02, 257/E21.24; 438/619, 623
See application file for complete search history.

(56) References Cited

U.S. PATENT DOCUMENTS

| 5,960,311 A * | 9/1999 | Singh et al. ................. 438/623 |
| 7,868,376 B2 | 1/2011 | Aoyama et al. |
| 2010/0237398 A1 | 9/2010 | Kamigaichi et al. |

FOREIGN PATENT DOCUMENTS

JP    2010-80853 A    4/2010

OTHER PUBLICATIONS

Kirk Prall, et al. "25nm 64Gb MLC NAND Technology and Scaling Challenges," Electron Devices Meeting (IEDM) 2010 IEEE International, pp. 5.2.1-5.2.4, Jan. 2011.

* cited by examiner

*Primary Examiner* — Theresa T Doan
(74) *Attorney, Agent, or Firm* — Oblon, Spivak, McClelland, Maier & Neustadt, L.L.P.

(57) ABSTRACT

A semiconductor memory device includes a semiconductor substrate, a plurality of element isolations, a plurality of first stacked bodies, a second stacked body, and an interlayer insulating film. Distance between each of the first stacked bodies and the second stacked body is longer than distance between adjacent ones of the first stacked bodies. A first void is formed in the interlayer insulating film between the first stacked bodies. A second void is formed in the interlayer insulating film between one of the first stacked bodies and the second stacked body. And, a lower end of the second void is located above a lower end of the first void.

6 Claims, 19 Drawing Sheets

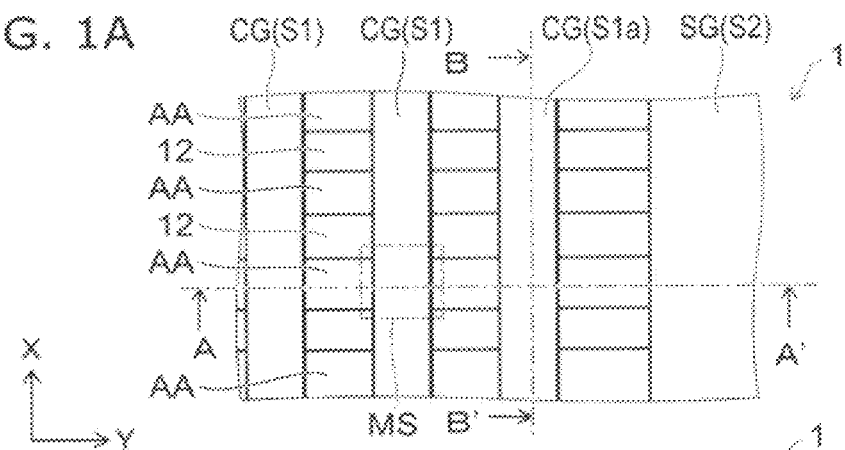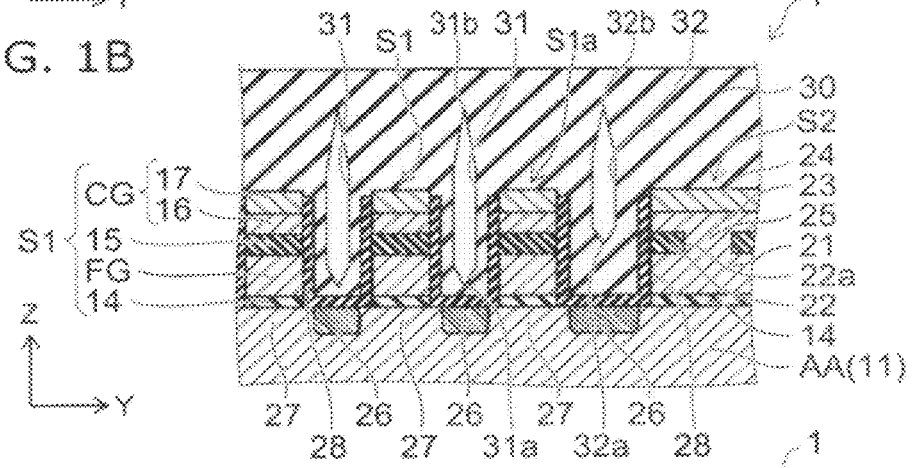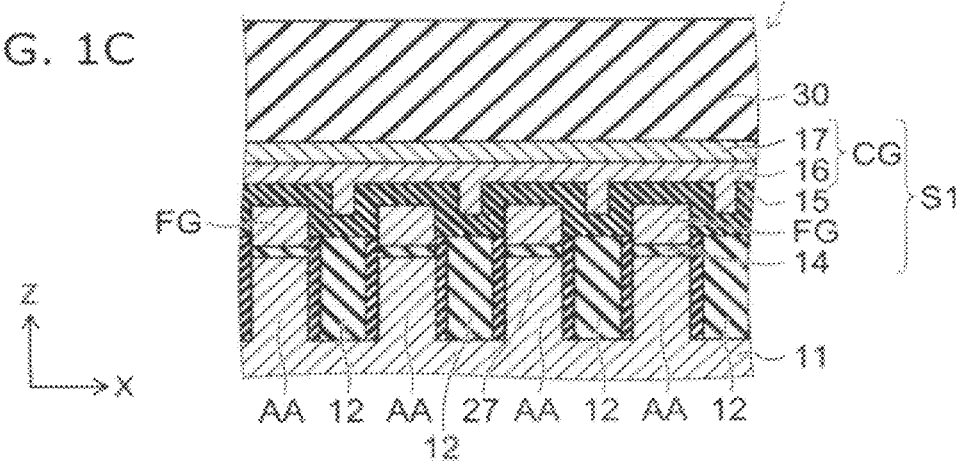

SEMICONDUCTOR MEMORY DEVICE AND METHOD FOR MANUFACTURING SAME

CROSS-REFERENCE TO RELATED APPLICATIONS

This application is based upon and claims the benefit of priority from the prior Japanese Patent Application No. 2011-062754, filed on Mar. 22, 2011; the entire contents of which are incorporated herein by reference.

FIELD

Embodiments described herein relate generally to a semiconductor memory device and a method for manufacturing the same.

BACKGROUND

In a NAND type semiconductor memory device, with the increase in the integration density of memory cells, a problem arises with the interference between adjacent memory cells. Thus, to suppress the interference between memory cells, a technique for forming a void (air gap) between memory cells has been proposed. However, the void may weaken the electric field from the neighboring memory cell to the channel of the selected cell and degrade the cell current.

BRIEF DESCRIPTION OF THE DRAWINGS

FIGS. 1A to 1C illustrate a semiconductor memory device according to a first embodiment;

DETAILED DESCRIPTION

Figure 2A:
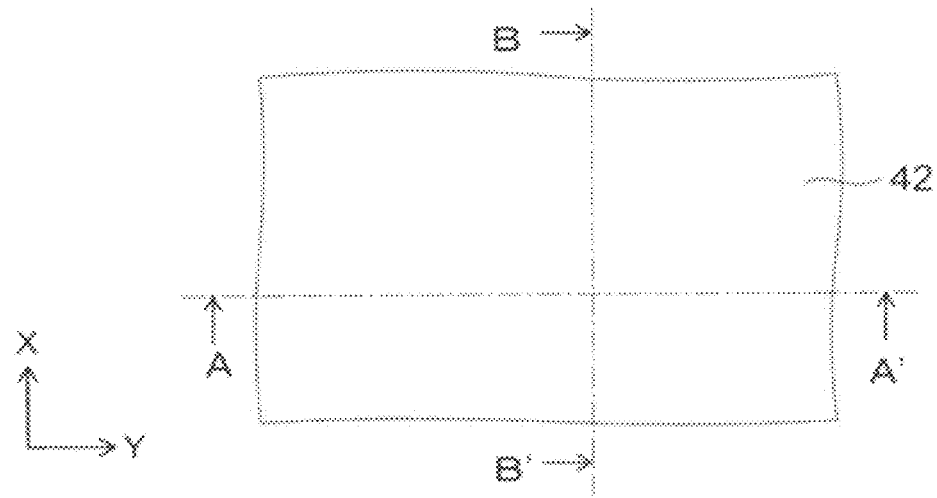
FIGS. 2A to 17C are process views illustrating a method for manufacturing a semiconductor memory device according to a second embodiment.

In general, according to one embodiment, a semiconductor memory device includes a semiconductor substrate, a plurality of element isolations, a plurality of first stacked bodies, a second stacked body, and an interlayer insulating film. The plurality of element isolations are formed in an upper portion of the semiconductor substrate and partition the upper portion into a plurality of active areas extending in a first direction. The plurality of first stacked bodies are provided on the semiconductor substrate and extend in a second direction crossing the first direction. The second stacked body is provided on the semiconductor substrate, is located outside a region populated with the plurality of first stacked bodies, and extends in the second direction. The interlayer insulating film covers the first stacked bodies and the second stacked body. Each of the first stacked bodies includes a first electrode provided above each of the active areas, an insulating film provided on the first electrode, and a second electrode provided on the insulating film and extending in the second direction. Distance between each of the first stacked bodies and the second stacked body is longer than distance between adjacent ones of the first stacked bodies. A first void is formed in the interlayer insulating film between the first stacked bodies. A second void is formed in the interlayer insulating film between one of the first stacked bodies and the second stacked body. And, a lower end of the second void is located above a lower end of the first void.

According to one embodiment, a method for manufacturing a semiconductor memory device, includes forming trenches extending in a first direction in an upper portion of a semiconductor substrate. The method includes partitioning the upper portion into a plurality of active areas by burying an insulating material in the trenches. The method includes forming a plurality of first stacked bodies and a second stacked body on the semiconductor substrate so that distance between the second stacked body and the neighboring one of the first stacked bodies is longer than that between adjacent ones of the first stacked bodies. The first stacked body extends in a second direction crossing the first direction. The first stacked body is formed by stacking a first electrode located above each of the active areas, an insulating film provided on the first electrode, and a second electrode provided on the insulating film and extending in the second direction. The second stacked body is located outside a region populated with the plurality of first stacked bodies. The second stacked body extends in the second direction. The method includes forming an interlayer insulating film so as to cover the first stacked bodies and the second stacked body, simultaneously forming a first void in the interlayer insulating film between the first stacked bodies and forming a second void in the interlayer insulating film between one of the first stacked bodies and the second stacked body, and locating a lower end of the second void above a lower end of the first void.

According to one embodiment, a method for manufacturing a semiconductor memory device, includes forming trenches extending in a first direction in an upper portion of a semiconductor substrate. The method includes partitioning the upper portion into a plurality of active areas by burying an insulating material in the trenches. The method includes forming a plurality of first stacked bodies and a second stacked body on the semiconductor substrate so that distance between each of the first stacked bodies and the second stacked body is longer than distance between adjacent ones of the first stacked bodies. The first stacked body extends in a second direction crossing the first direction. The first stacked body is formed by stacking a first electrode located above each of the active areas, an insulating film provided on the first electrode, and a second electrode provided on the insulating film and extending in the second direction. The second stacked body is located outside a region populated with the plurality of first stacked bodies. The second stacked body extends in the second direction. The method includes a first deposition step which is configured to form an interlayer insulating film so as to cover the first stacked bodies and the second stacked body, simultaneously form a first void in the interlayer insulating film between the first stacked bodies and form a second void in the interlayer insulating film between one of the first stacked bodies and the second stacked body, and seal an upper end of the first void with an upper end of the second void left open. The method includes a second deposition which is configured to fill a lower portion of the second void and seal the upper end of the second void by depositing an insulating material.

Embodiments of the invention will now be described with reference to the drawings.

First, a first embodiment is described.

FIGS. 1A to 1C illustrate a semiconductor memory device according to the embodiment. More specifically, FIG. 1A is a plan view. FIG. 1B is a sectional view taken along line A-A' shown in FIG. 1A. FIG. 1C is a sectional view taken along line B-B' shown in FIG. 1A.

The semiconductor memory device according to the embodiment is a NAND flash memory.

As shown in FIGS. 1A to 1C, the semiconductor memory device 1 according to the embodiment includes a silicon substrate 11. In an upper portion of the silicon substrate 11, a plurality of STIs (element isolations) 12 extending in one direction are formed. These STIs 12 partition the upper portion of the silicon substrate 11 into a plurality of active areas AA. The upper surface of the STI 12 is located above the upper surface of the active area AA.

In the following, for convenience of description, an XYZ orthogonal coordinate system is herein adopted. Among the directions parallel to the upper surface of the silicon substrate 11, the extending direction of the STI 12 and the active area AA is defined as Y direction, and the arranging direction of the STIs 12 and the active areas AA is defined as X direction. The direction perpendicular to the upper surface of the silicon substrate 11 is defined as Z direction.

On the silicon substrate 11, a plurality of stacked bodies S1 extending in the X direction are provided and equally spaced from each other. Outside the region populated with the plurality of stacked bodies S1, stacked bodies S2 are provided on both Y-direction sides of the region, one on each side. The length of the stacked body S2 in the Y direction is longer than the length of the stacked body S1. The distance between the stacked body S2 and the neighboring stacked body S1 in the Y direction is longer than the distance between adjacent stacked bodies S1. It is noted that the term "distance" used herein refers to the minimum distance.

In each stacked body S1, immediately above each active area AA, a tunnel insulating film 14 made of e.g. silicon oxide or silicon oxynitride is provided. Further thereon, for each active area AA, a floating gate electrode FG made of a conductive material such as polysilicon doped with impurity is provided. That is, as viewed in the Z direction, the tunnel insulating films 14 and the floating gate electrodes FG are arranged in a matrix configuration along the X and Y directions. The entirety of the tunnel insulating film 14 and the lower portion of the floating gate electrode FG are located between the STIs 12. The upper portion of the floating gate electrode FG is projected upward from the upper surface of the STI 12.

Furthermore, in the stacked body S1, an insulating film 15 is provided so as to cover the floating gate electrode FG. The insulating film 15 is made of an insulating material such as silicon oxide, silicon oxynitride, silicon nitride, or metal oxide, and has a monolayer or stacked structure. The insulating film 15 is provided immediately above the plurality of active areas AA. As a whole, the insulating film 15 extends in the X direction. However, reflecting the shape of the upper portion of the floating gate electrode FG projected from the upper surface of the STI 12, the insulating film 15 meanders in the XZ plane. On the insulating film 15, a control gate electrode CG extending in the X direction is provided. For instance, the lower portion 16 of the control gate electrode CG is formed from polysilicon doped with impurity. The upper portion 17 of the control gate electrode CG is formed from silicide such as nickel silicide, cobalt silicide, or tungsten silicide. Here, the upper portion 17 may be formed from a metal material such as tungsten or tungsten nitride. The meandering of the insulating film 15 is substantially absorbed by the lower portion 16 of the control gate electrode CG, and the upper surface of the lower portion 16 is generally flat.

In each stacked body S2, immediately above each active area AA, a tunnel insulating film 14 is provided. Further thereon, a select gate electrode SG extending in the X direction is provided. In the select gate electrode SG, a conductive portion 21, an insulating film 22, a conductive portion 23, and a conductive portion 24 are stacked in this order. The conductive portion 21 is provided immediately above each active area AA on the same level as the floating gate electrode FG of the stacked body S1. The insulating film 22 is provided immediately above each active area AA on the same level as the insulating film 15 of the stacked body S1. The conductive portion 23 is provided on the same level as the lower portion 16 of the control gate electrode CG of the stacked body S1 and extends in the X direction. The conductive portion 24 is provided on the same level as the upper portion 17 of the control gate electrode CG of the stacked body S1 and extends in the X direction. In the insulating film 22, an opening 22a is formed. In the opening 22a, a connecting member 25 is provided. The conductive portion 21 is formed from the same material as the floating gate electrode FG. The conductive portion 23 and the connecting member 25 are formed from the same material as the lower portion 16 of the control gate electrode CG. The conductive portion 24 is formed from the same material as the upper portion 17 of the control gate electrode CG.

Immediately below the region between adjacent ones of the stacked bodies S1 and S2 in the upper portion of the active area AA, a source/drain region 26 is formed. The portion sandwiched between the source/drain regions 26 in the upper portion of the active area AA constitutes a channel region 27.

A spacer insulating film 28 is provided on the side surface of the stacked body S1 except the upper part of the upper portion 17 of the control gate electrode CG, on the side surface of the stacked body S2 except the upper part of the conductive portion 24, and on the region of the upper surface of the active area AA and the STI 12 not covered with the stacked bodies S1 and S2. Furthermore, an interlayer insulating film 30 is provided on the silicon substrate 11 so as to cover the stacked bodies S1 and S2 and the spacer insulating film 28. In FIG. 1A, for clarity of illustration, the spacer insulating film 28 and the interlayer insulating film 30 are not shown.

In the interlayer insulating film 30, a void 31 is formed in the portion between the stacked bodies S1, and a void 32 is formed in the portion between the stacked body S1 and the stacked body S2. The voids 31 and 32 are shaped like strips extending in the X direction. The voids 31 and 32 are enclosed with the interlayer insulating film 30. The spacer insulating film 28 does not reach the voids 31 and 32. In the Z direction, the position of the lower end 32a of the void 32 is higher than the position of the lower end 31a of the void 31. For instance, the position of the lower end 31a of the void 31 is lower than the upper surface of the floating gate electrode FG. In contrast, the position of the lower end 32a of the void 32 is e.g. higher than the upper surface of the floating gate electrode FG and lower than the lower surface of the control gate electrode CG. The position of the upper end 31b of the void 31 and the upper end 32b of the void 32 is higher than the upper surface of the control gate electrode CG.

On the interlayer insulating film 30, a bit line (not shown) extending in the Y direction immediately above the active area AA is provided. In the interlayer insulating film 30, a bit line contact (not shown) for connecting the bit line to the active area AA is provided. Furthermore, in the interlayer insulating film 30, a source line (not shown) extending in the X direction and commonly connected to the active areas AA is provided. Thus, in the semiconductor memory device 1, a memory cell MS is formed for each intersection of the active area AA and the stacked body S1.

Next, the operation and effect of the embodiment are described.

In the semiconductor memory device 1 according to the embodiment, a void 31 is formed in the portion of the interlayer insulating film 30 between the stacked bodies S1. The void 31 is an air gap, and has a lower dielectric constant than the interlayer insulating film 30. This can suppress the influence which the voltage of the control gate electrode CG or the charges in the floating gated electrode belonging to one stacked body S1 exerts on the potential of the channel region 27 located immediately below the neighboring stacked bodies S1. That is, the interference between adjacent memory cells can be suppressed. Furthermore, the presence of the void 31 can increase the breakdown voltage between the control gate electrodes CG belonging to adjacent stacked bodies S1. This can reliably prevent short circuit between the control gate electrodes CG.

Furthermore, in the semiconductor memory device 1, a void 32 is formed in the portion of the interlayer insulating film 30 between the stacked body S1 and the stacked body S2. This can increase the breakdown voltage between the select gate electrode SG of the stacked body S2 and the control gate electrode CG belonging to the neighboring stacked body S1 (hereinafter also referred to as stacked body S1a). Thus, short circuit can be reliably prevented.

Typically, the driving voltage of the memory cell is determined by also taking into consideration the influence of the control gate electrode CG belonging to the neighboring stacked body S1 of a channel region 27, i.e., the electric field assisted effect. However, in the group (NAND string) of a plurality of stacked bodies S1, the outermost stacked body S1a has a longer distance to the neighboring stacked body, i.e., the stacked body S2. Hence, the outermost stacked body S1a experiences a smaller electric field assisted effect from the select gate electrode SG of the stacked body S2. Thus, when all the memory cells are driven by the same driving voltage, the cell current is made smaller only in the memory cell formed in the stacked body S1a. Hence, the channel current of the overall NAND string is limited by the cell current of the stacked body S1a. This phenomenon significantly occurs when, after the write/erase cycle of data, charge is accumulated in the interlayer insulating film 30 near the stacked body S1a on the stacked body S2 side. To avoid this, the driving voltage needs to be sufficiently increased. However, increasing the driving voltage requires higher breakdown voltage in each portion of the semiconductor memory device 1. This hampers downsizing of the semiconductor memory device 1.

Thus, in the embodiment, the lower end 32a of the void 32 is located above the lower end 31 of the void 31. Accordingly, the effect of the void 32 for suppressing the interference between memory cells is made smaller than the effect of the void 31 for suppressing the interference between memory cells. More specifically, the effect of the void 32 for suppressing the influence which the select gate electrode SG of the stacked body S2 exerts on the channel region 27 formed immediately below the neighboring stacked body S1a is smaller than the effect of the void 31 for suppressing the influence which the control gate electrode CG of one stacked body S1 exerts on the channel region 27 formed immediately below the neighboring stacked body S1. Thus, the channel region 27 formed immediately below the stacked body S1a can also experience an appropriate electric field assisted effect from the select gate electrode SG of the stacked body S2. This can suppress the phenomenon in which the cell current of the overall NAND string is limited by the channel current of the stacked body S1a.

In particular, the upper end 32b of the void 32 is located above the upper surface of the control gate electrode CG and the upper surface of the select gate electrode SG. Furthermore, the lower end 32a is located below the lower surface of the control gate electrode CG and the lower surface of the conductive portion 23. Thus, the void 32 is interposed in the entire region between the control gate electrode CG of the stacked body S1a and the conductive portions 23 and 24 of the select gate electrode SG of the stacked body S2. This can increase the breakdown voltage between the control gate electrode CG and the select gate electrode SG. Thus, short circuit can be prevented more reliably. Accordingly, sufficient breakdown voltage can be ensured when a high voltage is applied between the select gate electrode SG and the neighboring control gate electrode CG, such as at the time of erasing data.

Furthermore, the lower end 32a of the void 32 is located above the upper surface of the floating gate electrode FG and the upper surface of the conductive portion 21. Thus, the void 32 is not interposed between the channel region 27 formed immediately below the stacked body S1a and the conductive portion 21 of the select gate electrode SG. This can ensure the electric field assisted effect of the select gate electrode SG exerted on the channel region 27 formed immediately below the stacked body S1a.

Thus, according to the embodiment, the breakdown voltage between the control gate electrodes CG and between the control gate electrode CG and the select gate electrode SG can be increased. Furthermore, while suppressing the interference between memory cells, an appropriate electric field assisted effect can be realized in the memory cell of the outermost stacked body S1a. Hence, the cell current can be made uniform among memory cells. As a result, the integration density of memory cells can be increased.

Here, it is also possible to omit application of program voltage to the control gate electrode CG provided in the stacked body S1a. Accordingly, the memory cell formed next to the select gate electrode SG serves as a dummy cell in which no data is stored.

Next, a second embodiment is described.

The embodiment relates to a method for manufacturing the semiconductor memory device according to the above first embodiment.

FIGS. 2A to 17C are process views illustrating the method for manufacturing a semiconductor memory device according to the embodiment. The figures labeled with "A" are process plan views. The figures labeled with "B" are process sectional views taken along line A-A' shown in the corresponding figures labeled with "A". The figures labeled with "C" are process sectional views taken along line B-B' shown in the corresponding figures labeled with "A".

Figure 2B:
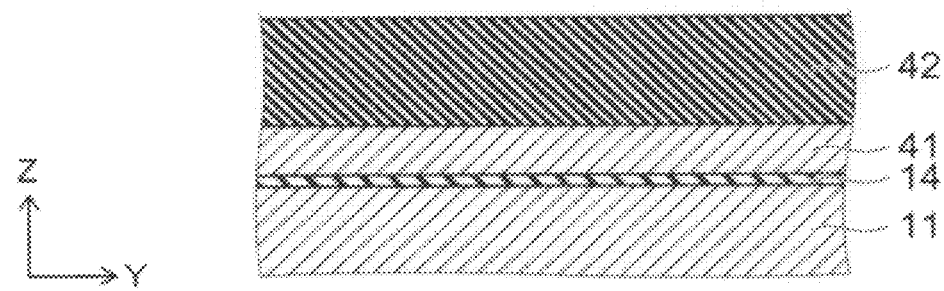
Figure 2C:
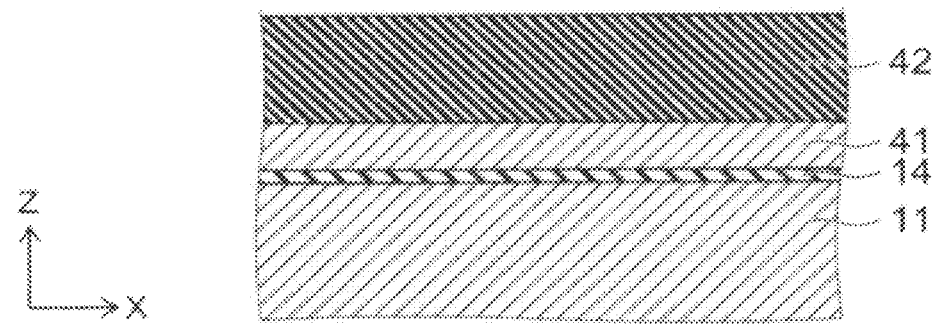

First, as shown in FIGS. 2A to 2C, a silicon substrate 11 is prepared. Next, on the entire surface of the silicon substrate 11, a tunnel insulating film 14 made of an insulating material such as silicon oxide and silicon oxynitride is formed. Next, silicon containing impurity is deposited on the entire surface to form a polysilicon film 41. Next, a mask material 42 is formed on the entire surface.

Figure 3A:
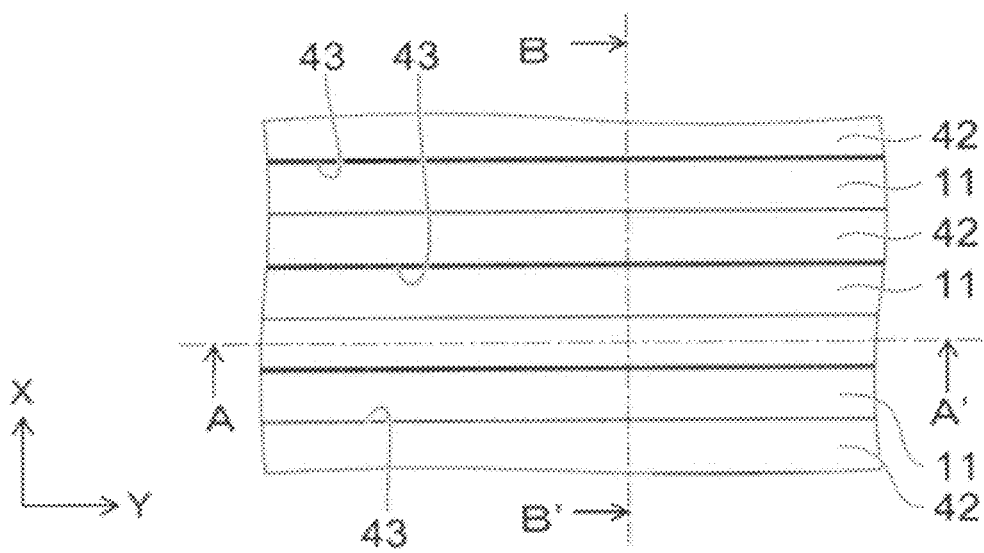
Figure 3B:
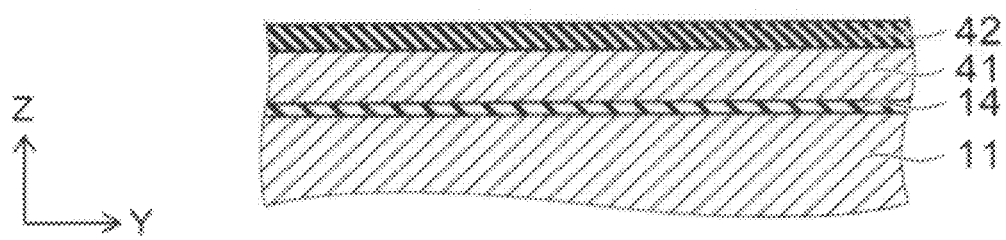
Figure 3C:
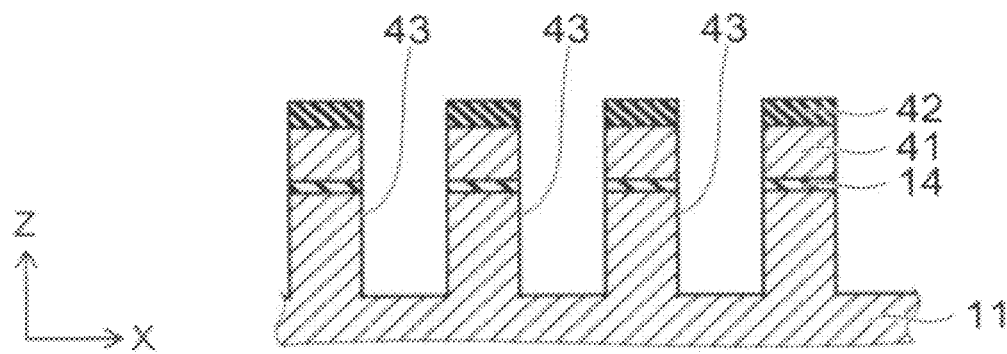

Next, as shown in FIGS. 3A to 3C, the mask material 42 is selectively etched and divided into a plurality of line-shaped portions extending in the Y direction. Next, the mask material 42 is used as a mask to perform etching. Thus, the polysilicon film 41 and the tunnel insulating film 14 are selectively etched, and an upper portion of the silicon substrate 11 is selectively etched. Accordingly, the polysilicon film 41 and the tunnel insulating film 14 are divided into a plurality of line-shaped portions extending in the Y direction, and a plurality of trenches 43 extending in the Y direction are formed in the upper portion of the silicon substrate 11.

Figure 4A:
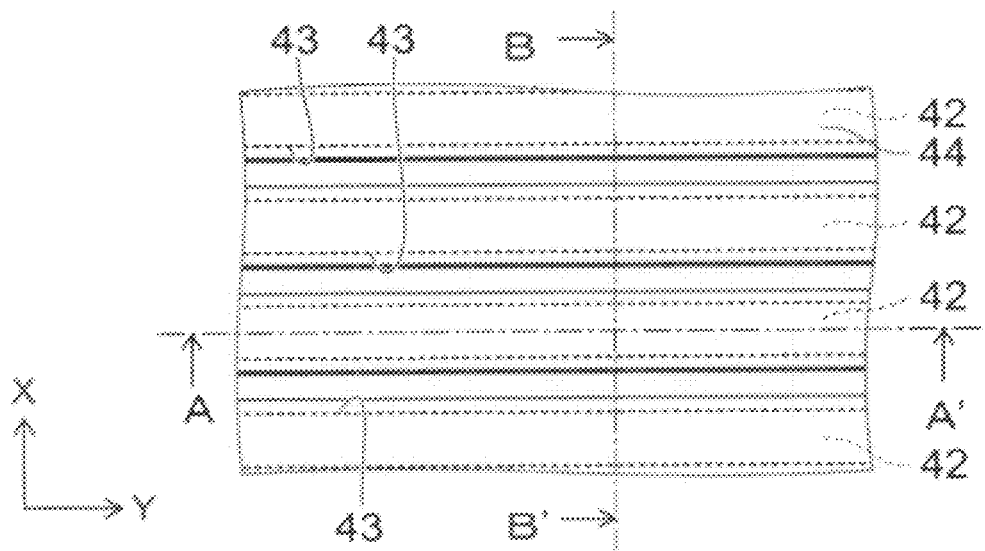
Figure 4B:
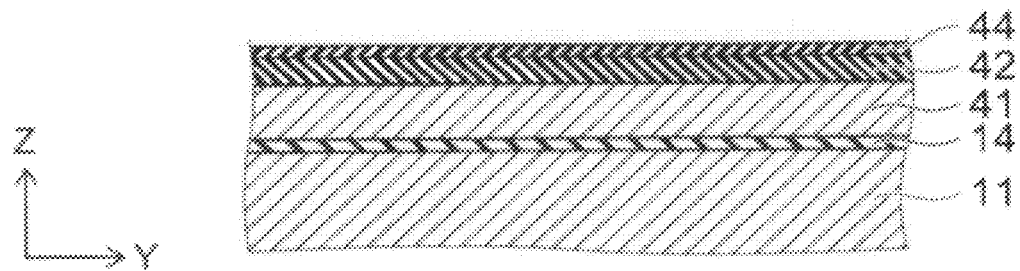
Figure 4C:
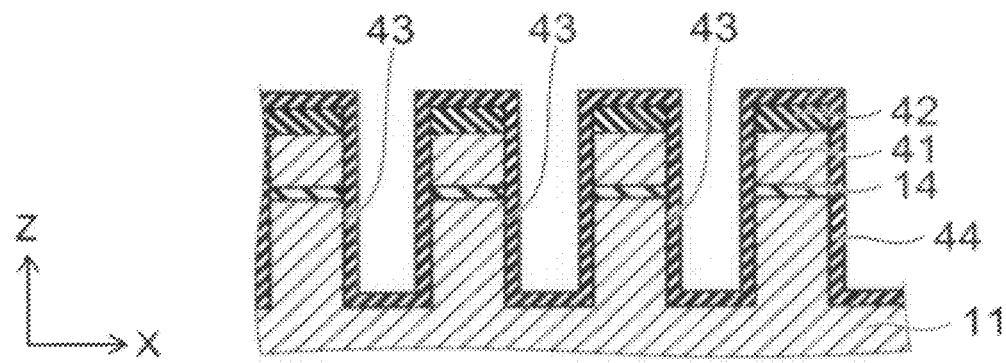

Next, as shown in FIGS. 4A to 4C, silicon oxide, for instance, is deposited on the entire surface to form an insulating film 44. The insulating film 44 is formed so as to cover the inner surface of the trench 43, and the outer surface of the divided tunnel insulating film 14, polysilicon film 41, and mask material 42.

Figure 5A:
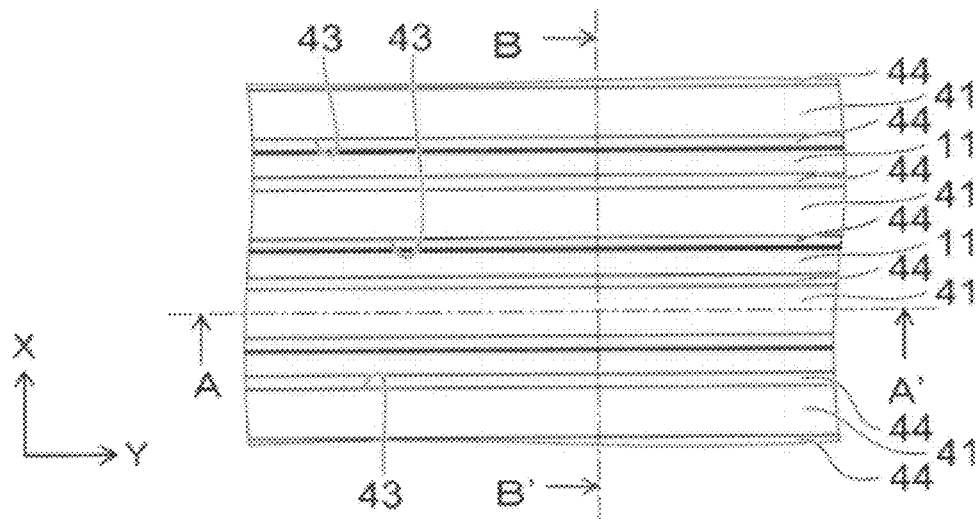
Figure 5B:
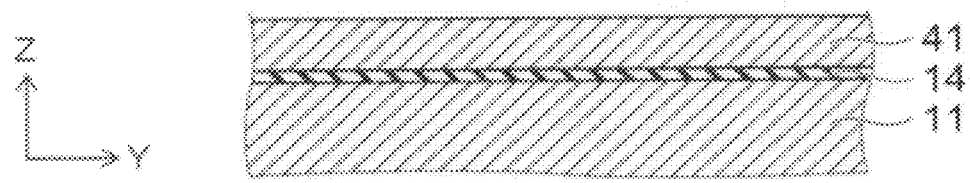
Figure 5C:
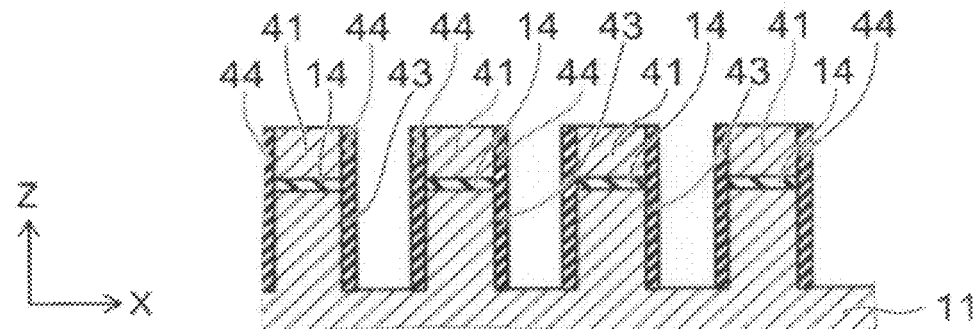

Next, as shown in FIGS. 5A to 5C, etch back is performed to remove the mask material 42 (see FIGS. 4A to 4C). At this time, the portion of the insulating film 44 formed on the upper surface of the mask material 42 and the portion formed on the bottom surface of the trench 43 are also removed.

Figure 6A:
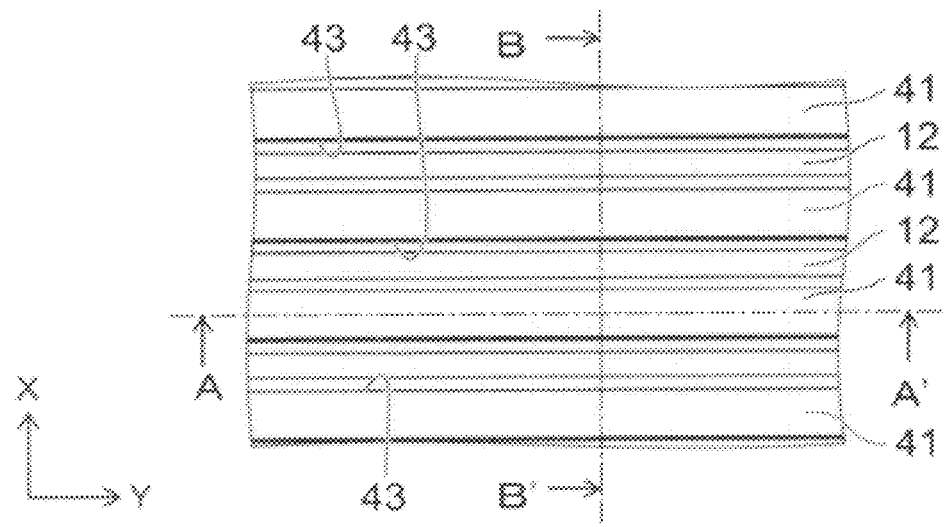
Figure 6B:
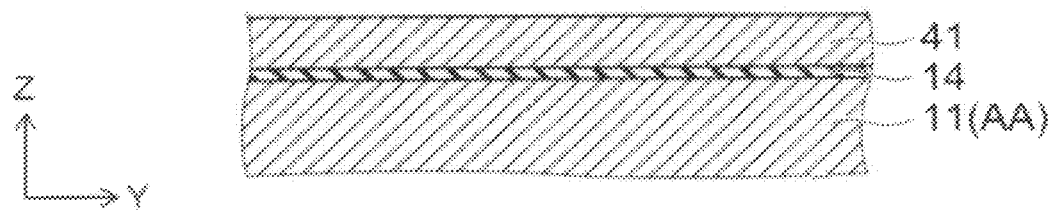
Figure 6C:
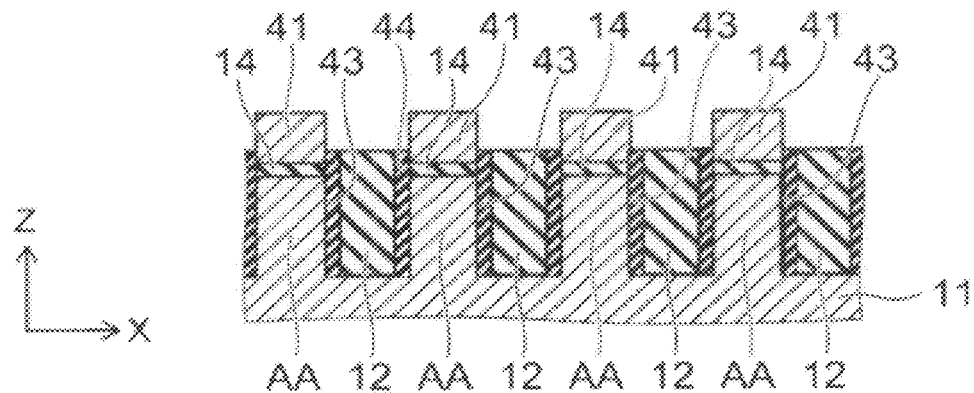

Next, as shown in FIGS. 6A to 6C, an insulating material such as silicon oxide, silicon oxynitride, silicon nitride, or metal oxide is deposited on the entire surface in a single layer or a plurality of layers. This insulating material is buried in the trench 43 and deposited on the polysilicon film 41. Next, etch back is performed. Thus, the portion of the deposited insulating material and the insulating film 44 located above the upper surface of the polysilicon film 41 and the portion located between the upper portions of the polysilicon film 41 are removed. As a result, an STI 12 is formed from the remaining portion of the insulating film 44 and the deposited insulating material. In the following, it is assumed that the STI 12 includes the insulating film 44. The position of the upper surface of the STI 12 is higher than the lower surface of the polysilicon film 41 and lower than its upper surface. By burying the STI 12 in the trench 43, the upper portion of the silicon substrate 11 is partitioned into a plurality of active areas AA extending in the Y direction.

Figure 7A:
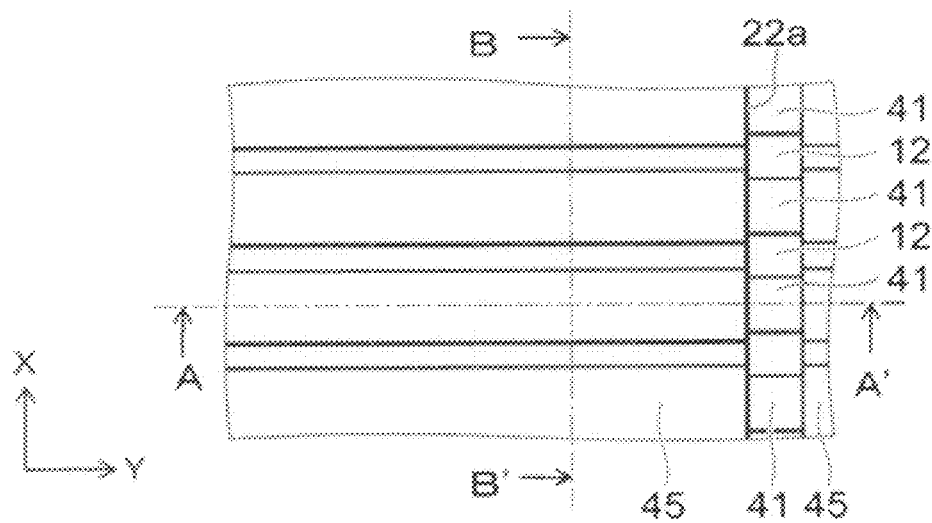
Figure 7B:
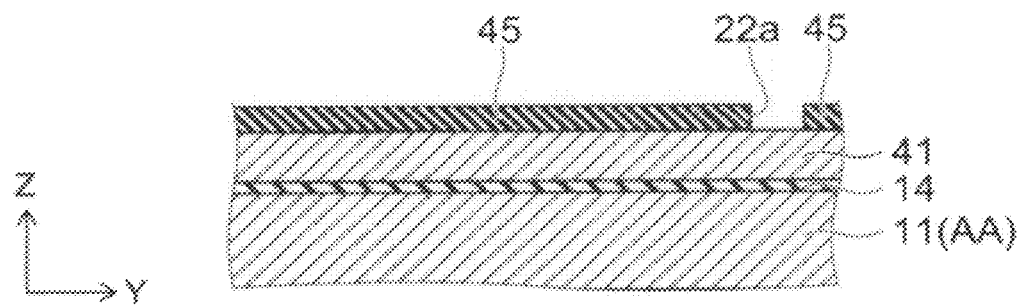
Figure 7C:
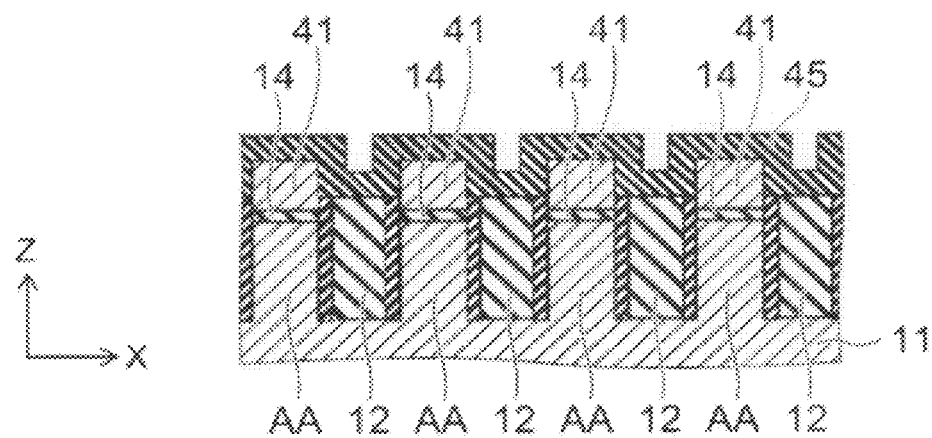

Next, as shown in FIGS. 7A to 7C, an insulating material such as silicon oxide is deposited on the entire surface. Thus, an insulating film 45 is formed so as to cover the STI 12 and the polysilicon film 41. Next, a strip-shaped opening 22a extending in the X direction is formed in the portion of the insulating film 45 where the stacked body S2 is to be formed.

Figure 8A:
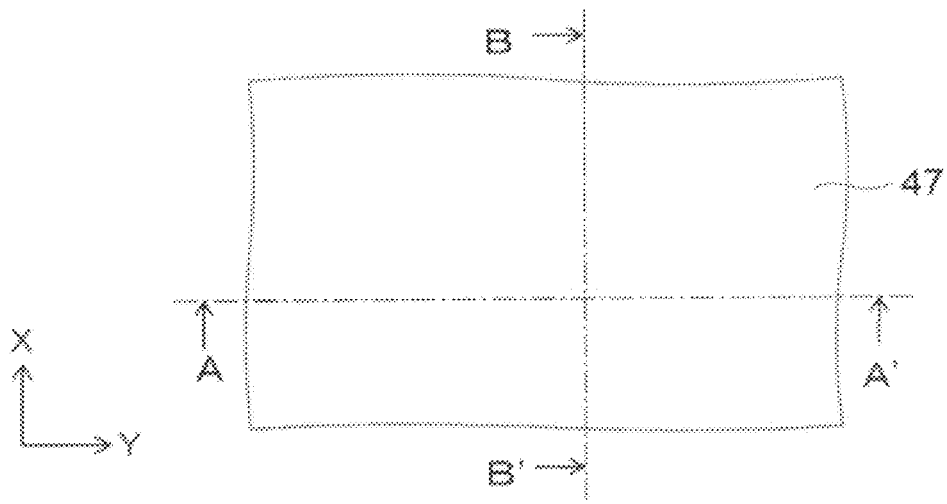
Figure 8B:
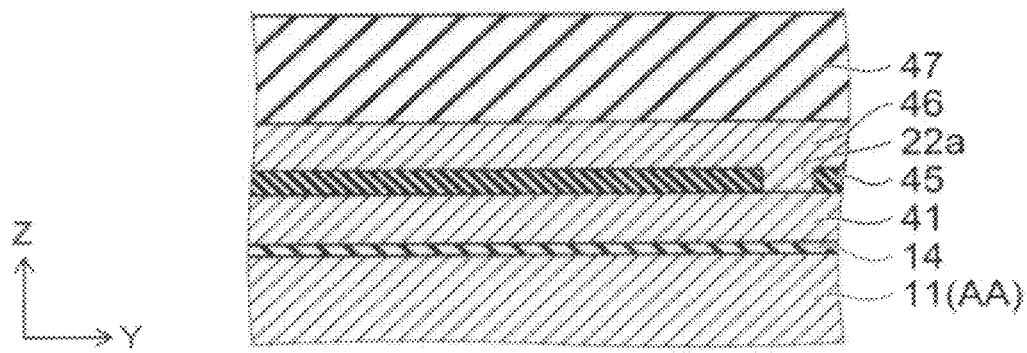
Figure 8C:
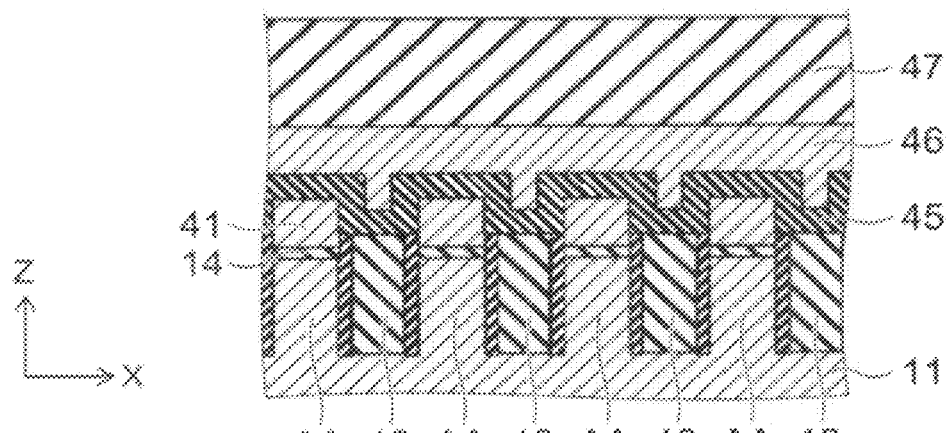

Next, as shown in FIGS. 8A to 8C, silicon doped with impurity, for instance, is deposited on the entire surface to form a polysilicon film 46. The polysilicon film 46 also enters into the opening 22a and is brought into contact with the polysilicon film 41. Next, a mask material 47 is deposited on the entire surface.

Figure 9A:
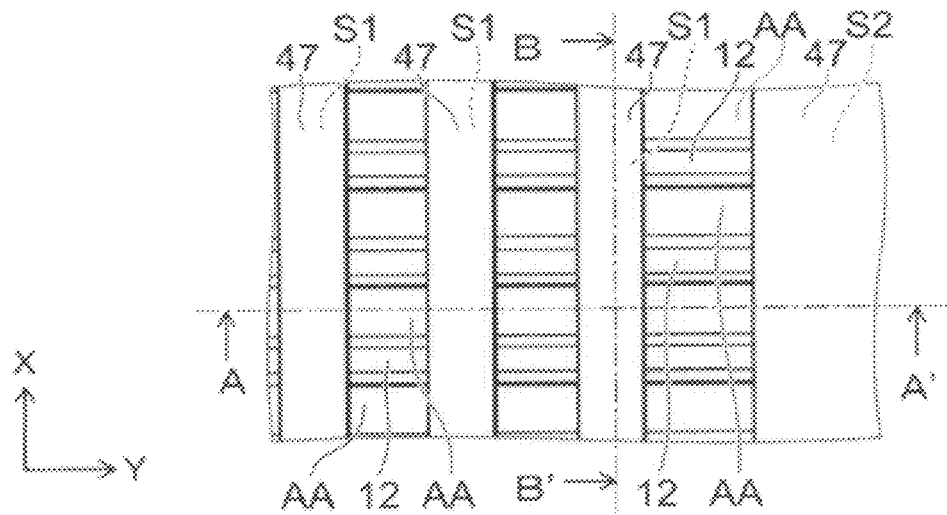
Figure 9B:
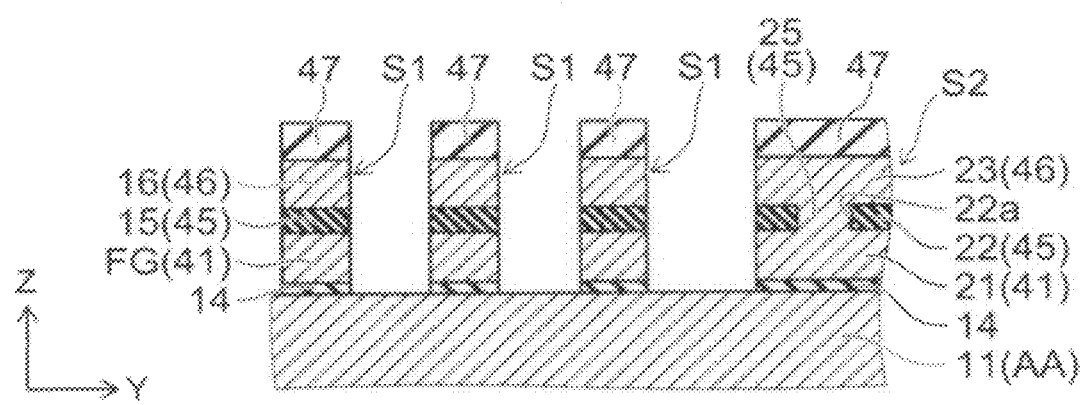
Figure 9C:
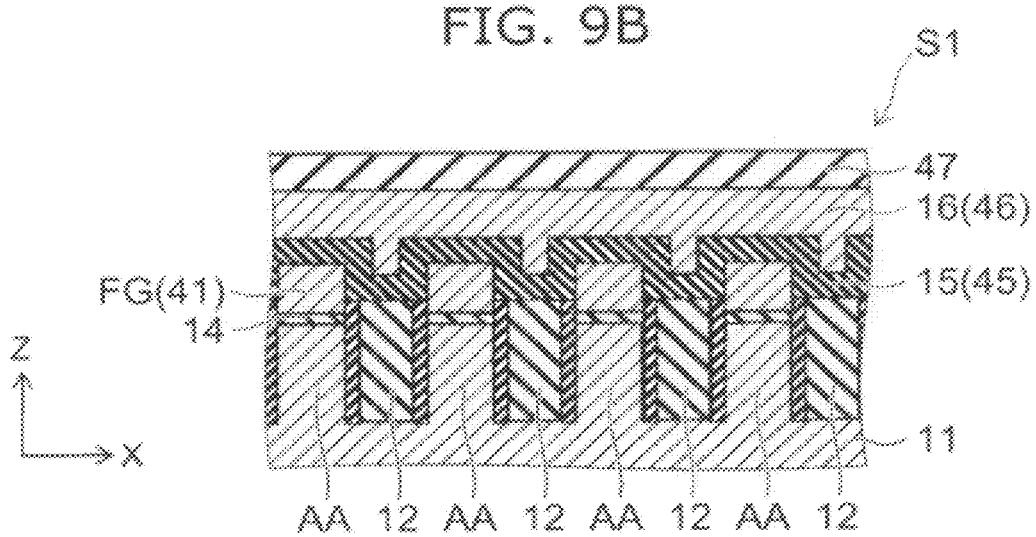

Next, as shown in FIGS. 9A to 9C, the mask material 47 is processed into a plurality of line-shaped portions extending in the X direction. Next, this mask material 47 is used as a mask to perform etching such as RIE (reactive ion etching). Thus, the polysilicon film 46, the insulating film 45, the polysilicon film 41, and the tunnel insulating film 14 are selectively etched and divided into a plurality of line-shaped portions extending in the X direction. Accordingly, a plurality of stacked bodies S1, and stacked bodies S2 located on both sides of the region populated with these stacked bodies S1, one stacked body S2 on each side, are formed. The stacked bodies S1 are equally spaced. The distance between the stacked body S1 and the stacked body S2 is made longer than the distance between adjacent stacked bodies S1. Between adjacent ones of the stacked bodies S1 and S2, the active area AA and the STI 12 are exposed.

Here, the tunnel insulating film 14 and the polysilicon film 41 have already been divided into line-shaped portions extending in the Y direction in the step shown in FIGS. 3A to 3C. Hence, by being divided in this step, they are divided along both the X and Y directions and partitioned into a plurality of portions arranged in a matrix configuration. The portion of the polysilicon film 41 located in the stacked body S1 constitutes a floating gate electrode FG, and the portion located in the stacked body S2 constitutes a conductive portion 21. The portion of the insulating film 45 located in the stacked body S1 constitutes an insulating film 15, and the portion located in the stacked body S2 constitutes an insulating film 22. The portion of the polysilicon film 46 located in the stacked body S1 constitutes the lower portion 16 of a control gate electrode CG, and the portion located in the stacked body S2 constitutes a conductive portion 23. The portion of the polysilicon film 46 buried in the opening 22a constitutes a connecting member 25.

Figure 10A:
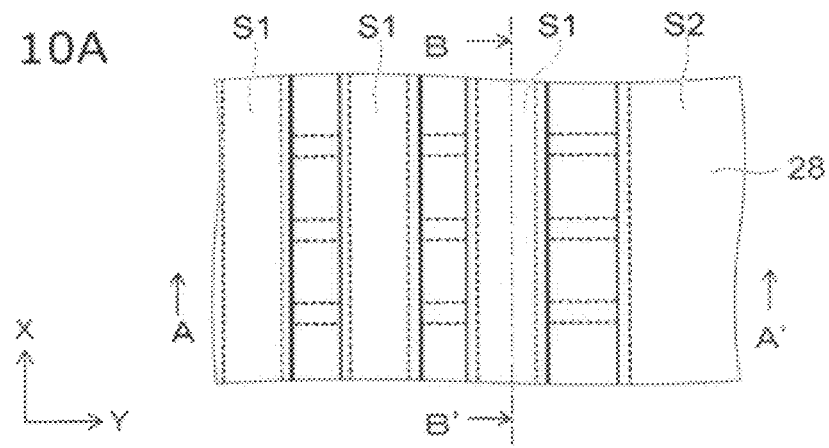
Figure 10B:
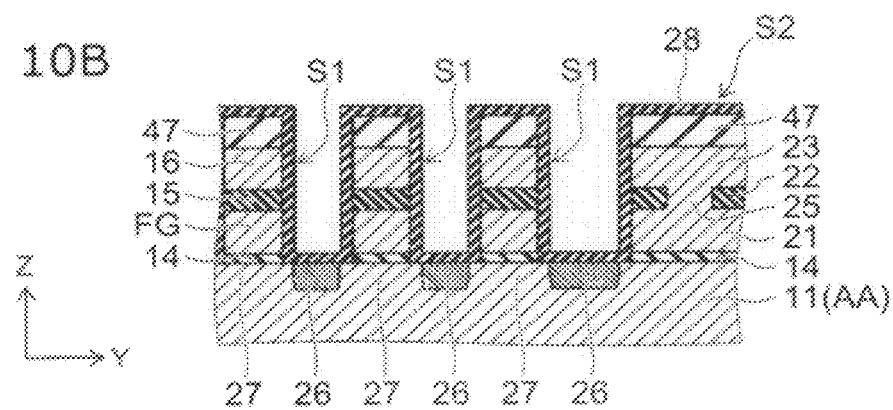
Figure 10C:
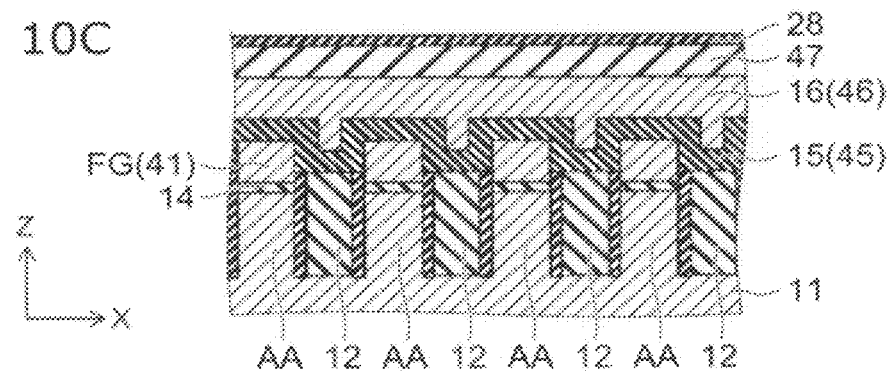

Next, as shown in FIGS. 10A to 10C, silicon oxide, for instance, is deposited on the entire surface to form a spacer insulating film 28. The spacer insulating film 28 is formed so as to cover the active area AA, the STI 12, and the stacked bodies S1 and S2. However, the spacer insulating film 28 is thinly formed so that its portions formed on the side surface of the adjacent stacked bodies S1 and S2 are not brought into contact with each other. Next, the stacked bodies S1 and S2 and the spacer insulating film 28 are used as a mask to perform ion implantation of impurity. Thus, a source/drain region 26 is formed in the portion of the active area AA except immediately below the stacked bodies S1 and S2 and the spacer insulating film 28. The portion of the active area AA between the source/drain regions 26 constitutes a channel region 27.

Figure 11A:
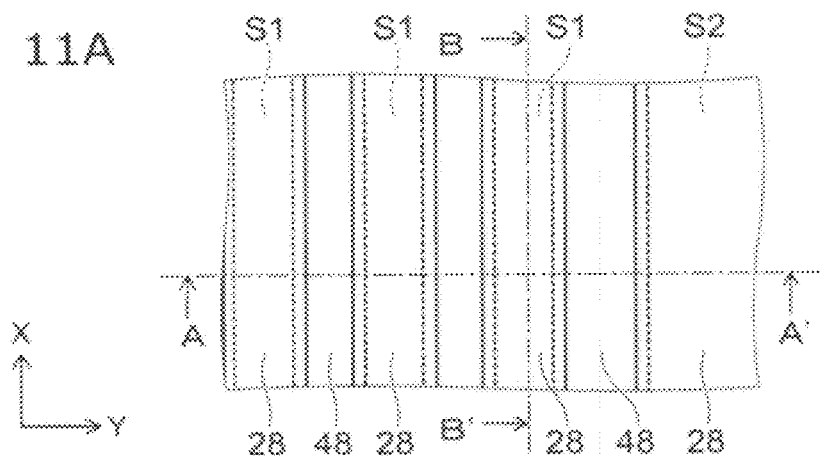
Figure 11B:
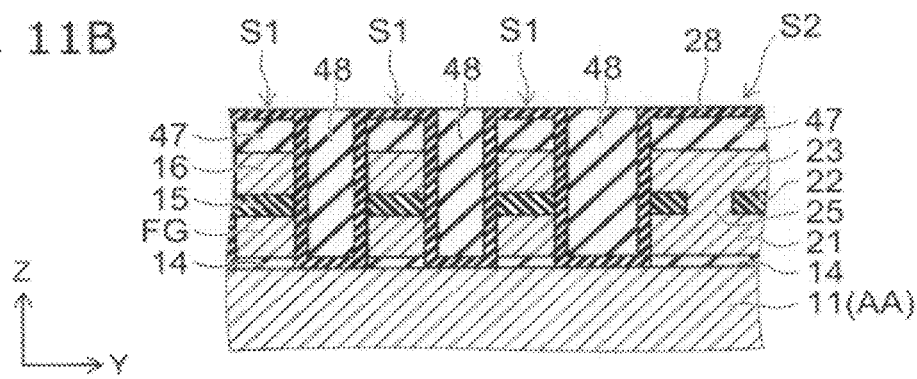
Figure 11C:
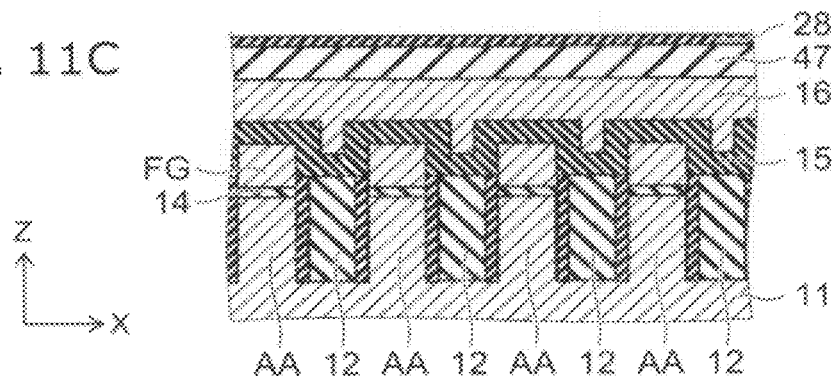

Next, as shown in FIGS. 11A to 11C, a sacrificial film 48 is deposited on the entire surface. The sacrificial film 48 is buried between adjacent ones of the stacked bodies S1 and S2 and deposited also above the stacked bodies S1 and S2. Next, the spacer insulating film 28 is used as a stopper to perform RIE. Thus, the portion of the sacrificial film 48 located on the upper surface of the stacked bodies S1 and S2 is removed. Accordingly, the sacrificial film 48 remains only between adjacent ones of the stacked bodies S1 and S2.

Figure 12A:
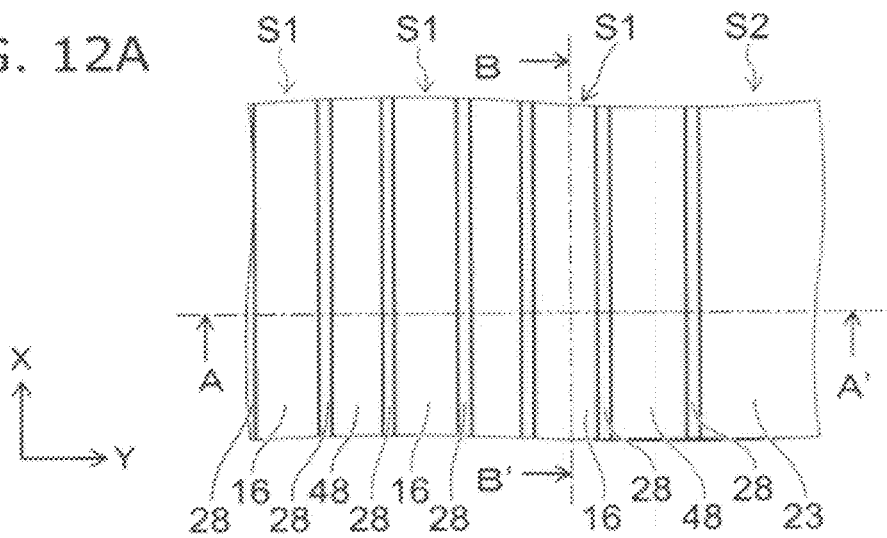
Figure 12B:
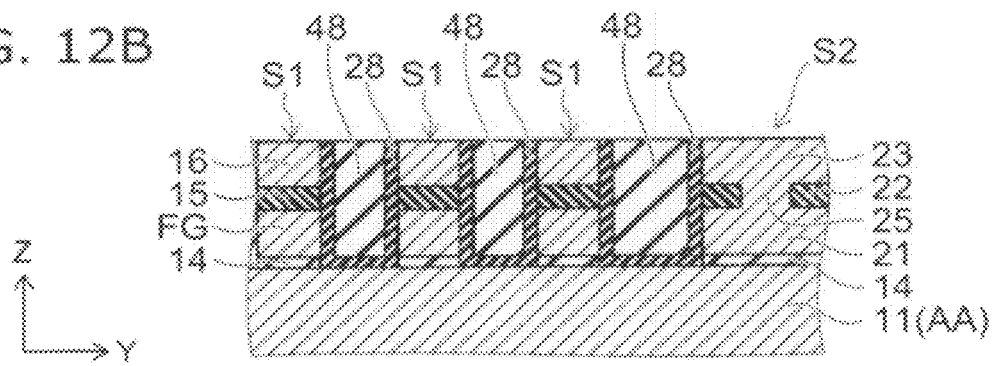
Figure 12C:
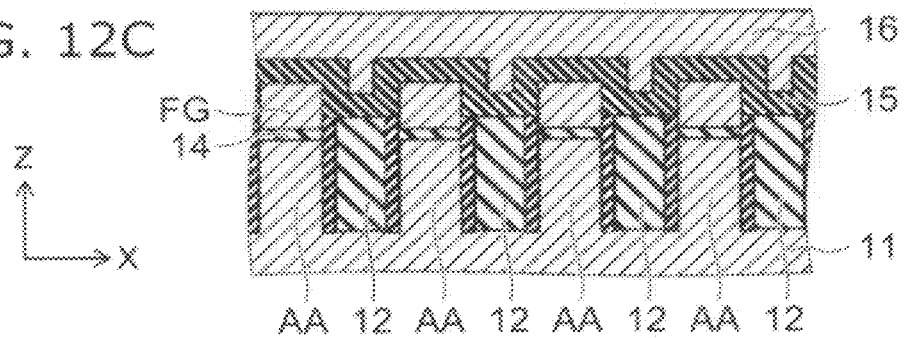

Next, as shown in FIGS. 12A to 12C, etch back is performed to remove the mask material 47 from the upper portion of the stacked body S1 and the upper portion of the stacked body S2. At this time, the portion of the sacrificial film 48 located between the mask materials 47 is also removed. Furthermore, the portion of the spacer insulating film 28 located on the upper surface and side surface of the mask material 47 is also removed.

Figure 13A:
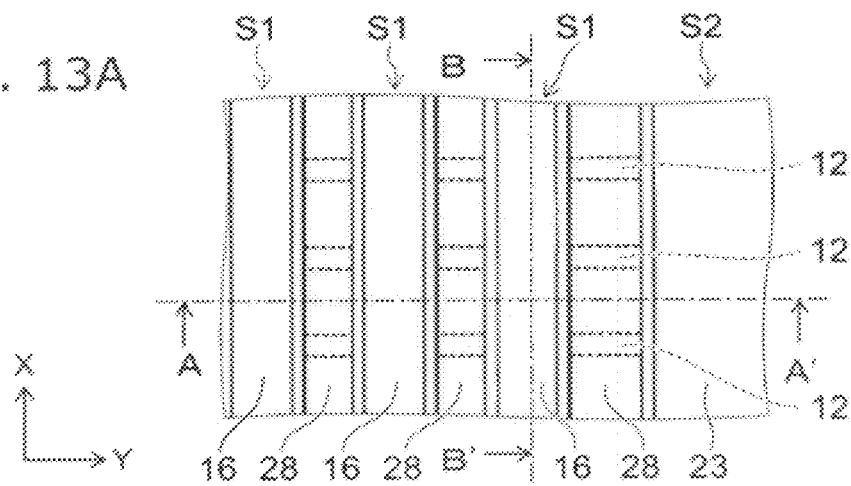
Figure 13B:
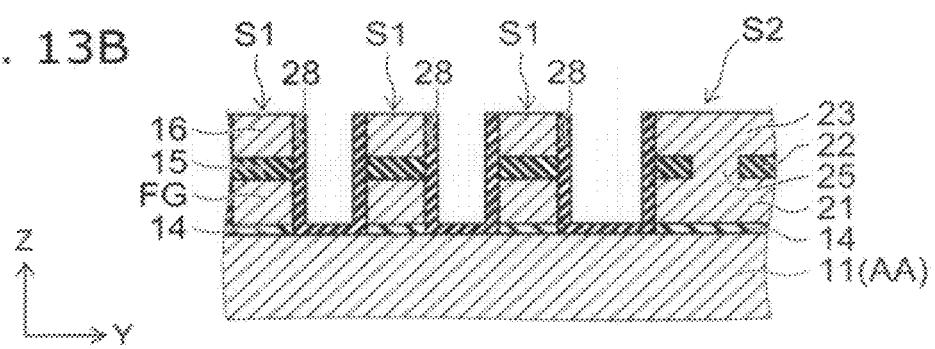
Figure 13C:
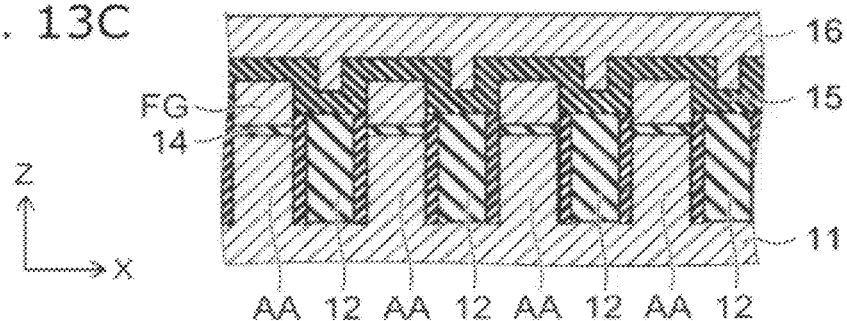

Next, as shown in FIGS. 13A to 13C, the sacrificial film 48 (see FIGS. 12A to 12C) is removed.

Figure 14A:
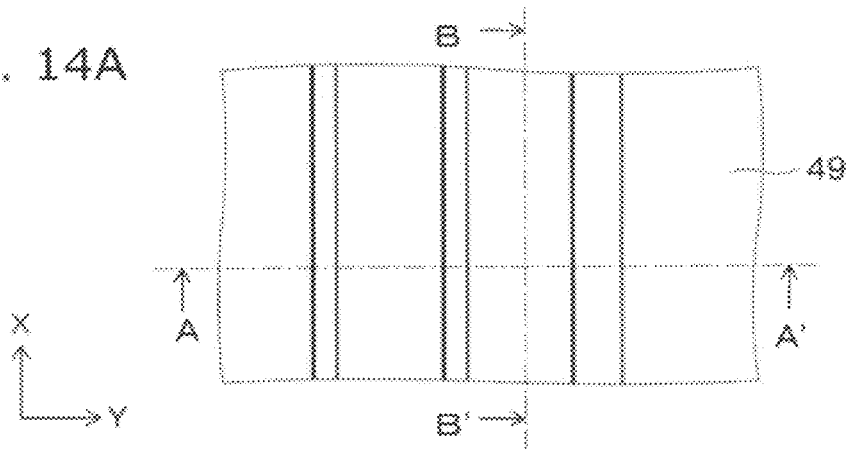
Figure 14B:
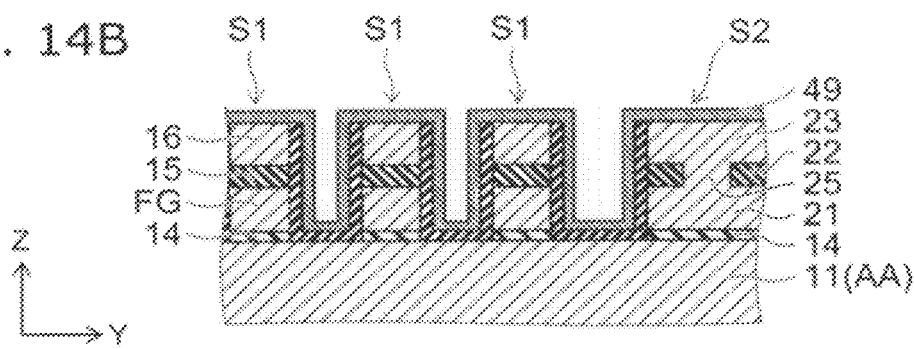
Figure 14C:
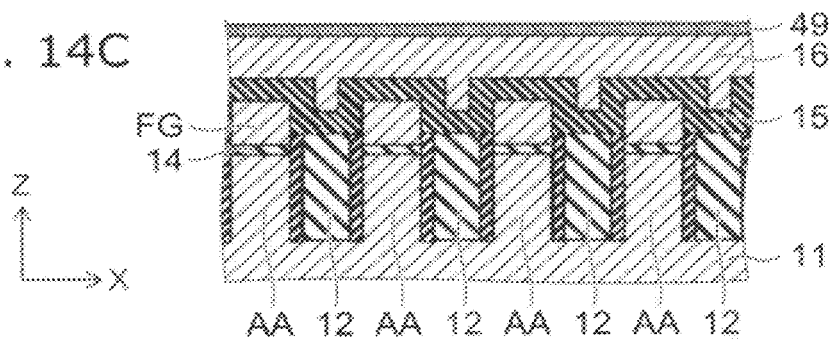

Next, as shown in FIGS. 14A to 14C, a metal such as nickel, cobalt, or tungsten is deposited on the entire surface to form a metal film 49.

Figure 15A:
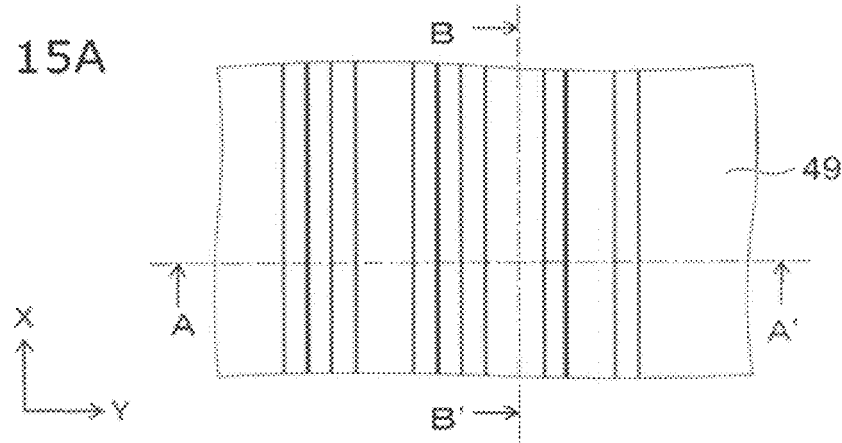
Figure 15B:
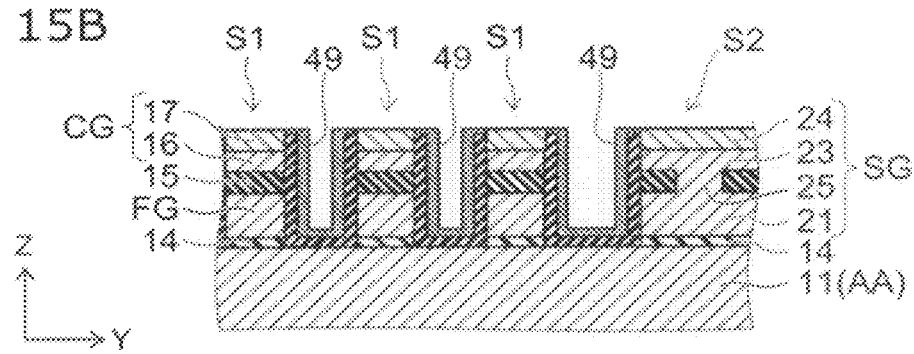
Figure 15C:
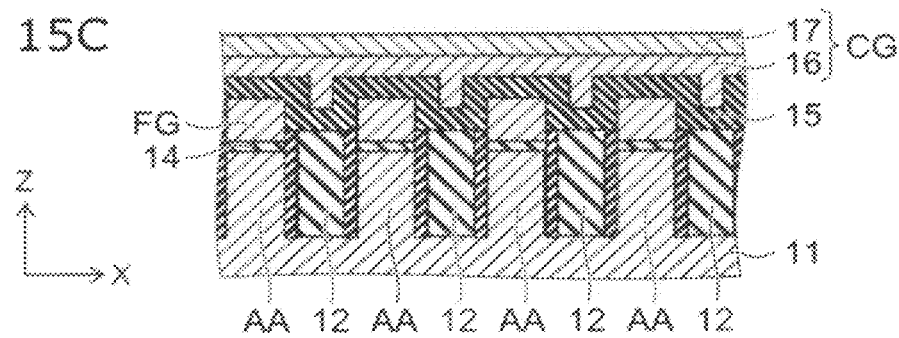

Next, as shown in FIGS. 15A to 15C, heat treatment is performed to cause reaction between silicon of the polysilicon film 46 and the metal of the metal film 49. Thus, the metal is silicidized. Accordingly, the upper portion 17 of the control gate electrode CG is formed in the upper portion of the stacked body S1, and a conductive portion 24 is formed in the upper portion of the stacked body S2. The conductive portions 21, 23, 24 and the connecting member 25 constitute a select gate electrode SG.

Figure 16A:
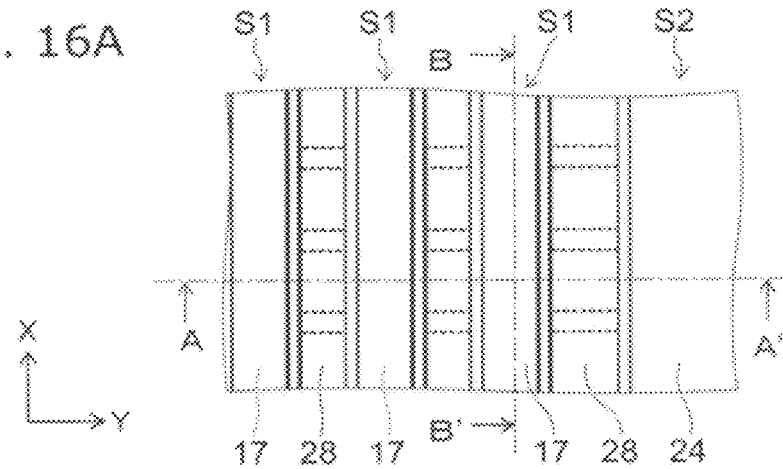
Figure 16B:
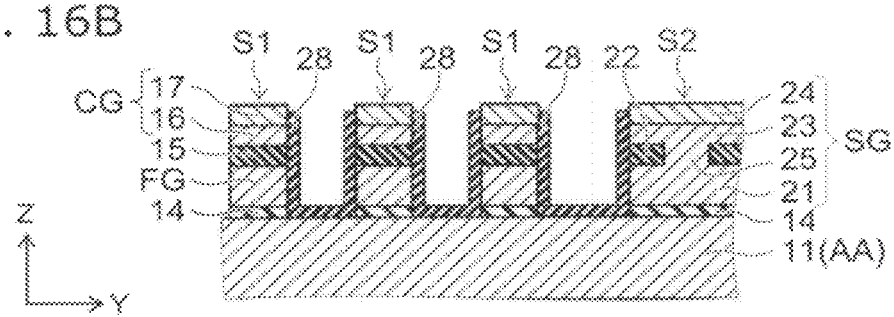
Figure 16C:
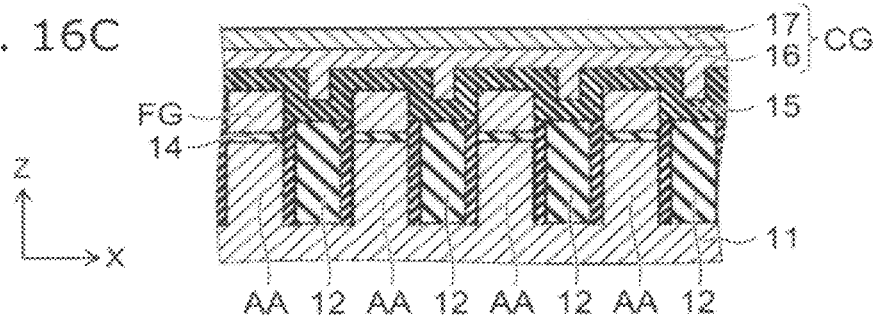

Next, as shown in FIGS. 16A to 16C, the unreacted metal film 49 (see FIGS. 15A to 15C) is removed by e.g. wet etching.

Figure 17A:
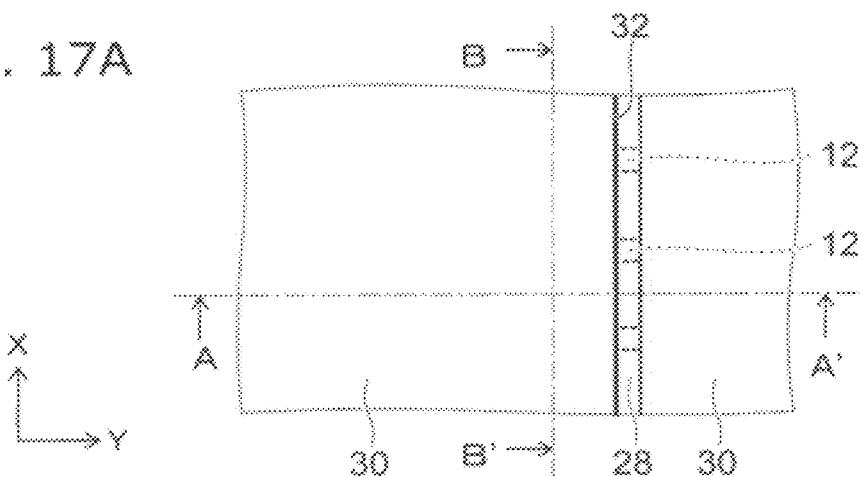
Figure 17B:
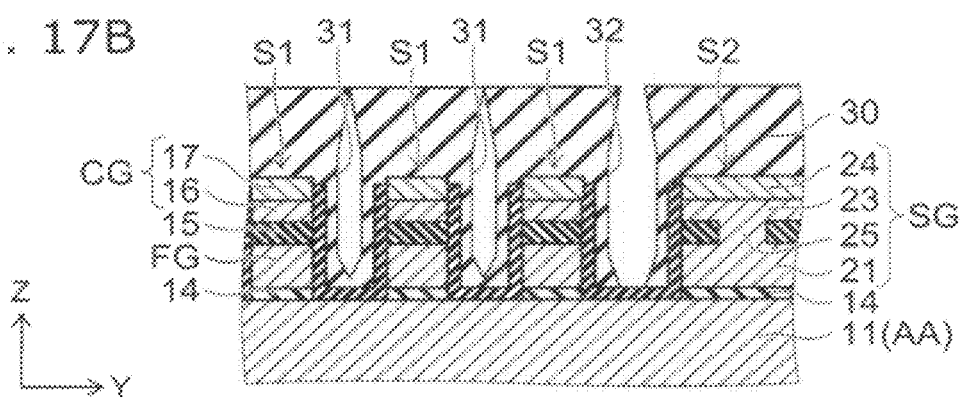
Figure 17C:
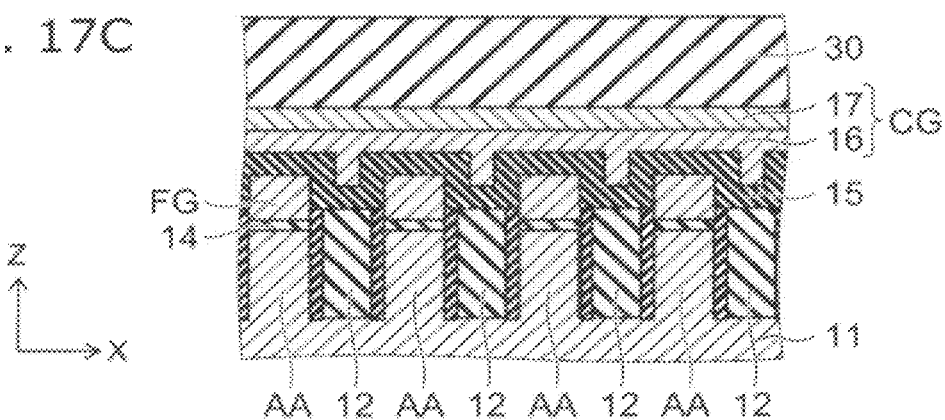

Next, as shown in FIGS. 17A to 17C, an insulating material such as silicon oxide is deposited to form an interlayer insulating film 30. This deposition is performed by a method with relatively low buriability, such as the CVD (chemical vapor deposition) method. Thus, the insulating material is first deposited in a layered configuration on the side surface and upper surface of the stacked bodies S1 and S2 and on the upper surface of the active area AA and the STI 12. At this time, a void 31 opened upward is formed between the stacked bodies S1. Furthermore, a void 32 opened upward is formed between the stacked body S1 and the stacked body S2.

Subsequently, by continuing the deposition, the portions of the insulating material deposited on the side surfaces of the upper portions of the stacked bodies S1 are brought into contact with each other. Thus, the upper end 31b of the void 31 is sealed. The position of the lower end 31a of the void 31 at this stage is lower than the upper surface of the floating gate electrode FG. Furthermore, the position of the upper end 31b of the void 31 is higher than the upper surface of the control gate electrode CG. On the other hand, the distance between the stacked body S1 and the stacked body S2 is longer than the distance between adjacent stacked bodies S1. Hence, at this stage, the upper end 32b of the void 32 is not sealed.

Subsequently, by further continuing the deposition, the insulating material penetrates into the void 32. This raises the position of the lower end 32a of the void 32. On the other hand, because the void 31 has already been sealed, the insulating material does not newly penetrate therein. As a result, the position of the lower end 32a of the void 32 is made higher than the position of the lower end 31a of the void 31.

Subsequently, as shown in FIGS. 1A to 1C, by further continuing the deposition, the upper end 32b of the void 32 is also sealed. Although the deposition of the insulating material is further continued, the insulating material does not penetrate into the voids 31 and 32. At this stage, the position of the lower end of the void 32 is higher than the upper surface of the floating gate electrode FG, e.g. higher than the lower surface of the control gate electrode CG. Furthermore, the position of the upper end of the void 32 is higher than the upper surface of the control gate electrode CG, e.g. nearly as high as the position of the upper end of the void 31.

Thus, by depositing the insulating material with controlled buriability, an interlayer insulating film 30 is formed so as to cover the stacked bodies S1 and S2. Simultaneously, in the interlayer insulating film 30, a void 31 can be formed between the stacked bodies S1, and a void 32 can be formed between the stacked body S1 and the stacked body S2. Furthermore, the position of the lower end of the void 32 can be located above the position of the lower end of the void 31.

The buriability of the interlayer insulating film 30 can be controlled by e.g. adjusting the film formation condition. For instance, the buriability can be controlled by adjusting the film formation rate of the interlayer insulating film 30. Lower film formation rate results in higher buriability. Higher film formation rate results in lower buriability. The film formation rate can be decreased by e.g. decreasing the gas flow rate, decreasing the plasma power, or decreasing the pressure.

Furthermore, the buriability can be controlled by adjusting the directivity of film forming species. If the directivity of film forming species is high, the insulating material is deposited preferentially on the bottom surface of the void. The directivity of film forming species can be increased by e.g. intensifying the electric field or decreasing the pressure.

Furthermore, the buriability can be controlled by adjusting the impingement velocity of film forming species. If the impingement velocity of film forming species is high, the sidewall is etched, and the buriability is decreased. Conversely, if the impingement velocity of film forming species is low, the buriability is enhanced. The impingement velocity of film forming species can be increased by e.g. intensifying the electric field.

Furthermore, the buriability can be controlled also by selecting the shape of the stacked bodies and the distance therebetween. For instance, if the YZ cross section of the stacked body is shaped like a trapezoid with the lower side longer than the upper side, the lower portion of the void is filled more easily. Furthermore, as described above, a longer distance between the stacked bodies results in delaying the timing of sealing the upper end, and the void is filled more easily.

After forming the interlayer insulating film 30, a contact hole (not shown) reaching the active area AA is formed in the interlayer insulating film 30. A conductive material is buried in the contact hole to form a bit line contact (not shown). Next, a bit line (not shown) extending in the Y direction is formed on the interlayer insulating film 30 immediately above the active area AA so as to be connected to the bit line contact. Thus, the semiconductor memory device 1 according to the above first embodiment is manufactured.

According to the embodiment, the distance between the stacked body S1 and the stacked body S2 is made longer than the distance between the stacked bodies S1. Furthermore, the buriability of the insulating material is controlled when the interlayer insulating film 30 is formed. Thus, a void 31 can be formed between adjacent stacked bodies S1, and a void 32 can be formed between the stacked body S1 and the stacked body S2. The position of the lower end of the void 32 can be made higher than the position of the lower end of the void 31. Thus, the semiconductor memory device according to the above first embodiment can be manufactured.

Next, a third embodiment is described.

The embodiment also relates to a method for manufacturing the semiconductor memory device according to the above first embodiment.

FIGS. 18A to 19C are process views illustrating the method for manufacturing a semiconductor memory device according to the embodiment. The figures labeled with "A" are process plan views. The figures labeled with "B" are process sectional views taken along line A-A' shown in the corresponding figures labeled with "A". The figures labeled with "C" are process sectional views taken along line B-B' shown in the corresponding figures labeled with "A".

First, the process shown in FIGS. 2A to 16C is performed. Thus, the structure shown in FIGS. 16A to 16C is fabricated.

Figure 18A:
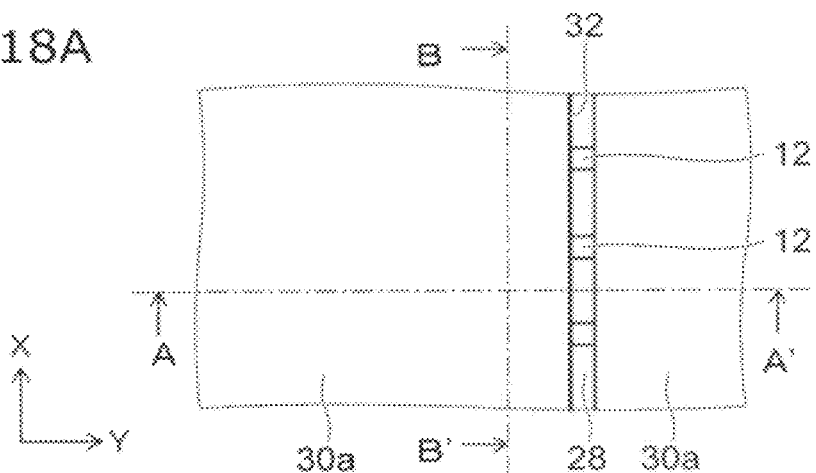
FIGS. 18A to 19C are process views illustrating a method for manufacturing a semiconductor memory device according to a third embodiment.
Figure 18B:
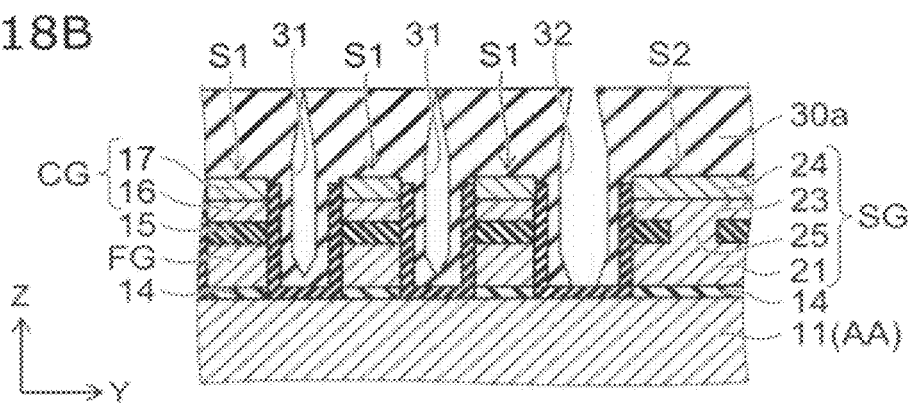
Figure 18C:
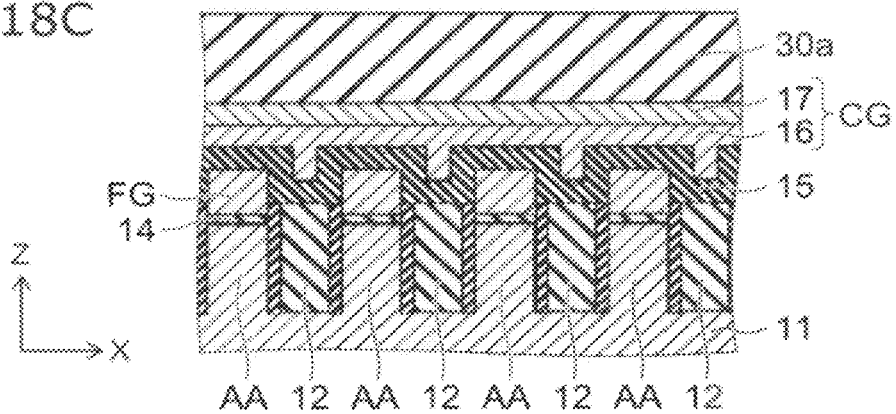

Next, as shown in FIGS. 18A to 18C, an insulating material such as silicon oxide is deposited. This deposition is performed by a method with relatively low buriability, such as the CVD method. Thus, an interlayer insulating film 30a covering the stacked bodies S1 and S2 is formed on the silicon substrate 11. Simultaneously, in the interlayer insulating film 30a, a void 31 is formed between the stacked bodies S1, and a void 32 is formed between the stacked body S1 and the stacked body S2. Then, with the upper end of the void 32 left open, the upper end of the void 31 is sealed.

Figure 19A:
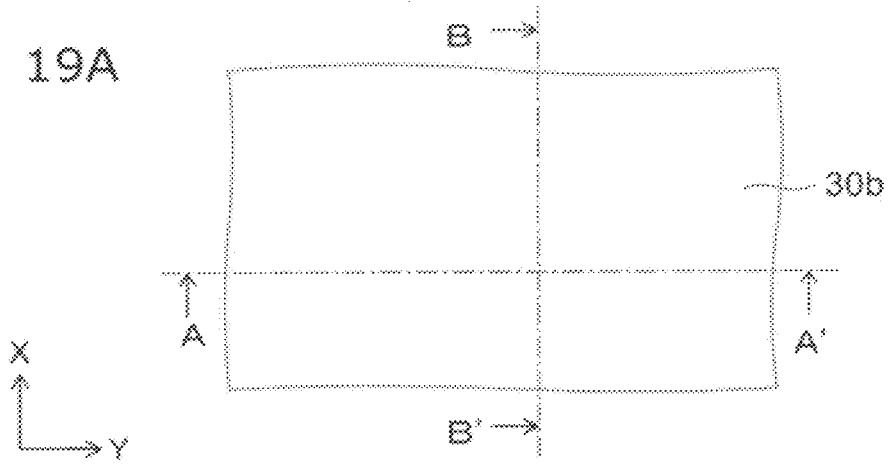
Figure 19B:
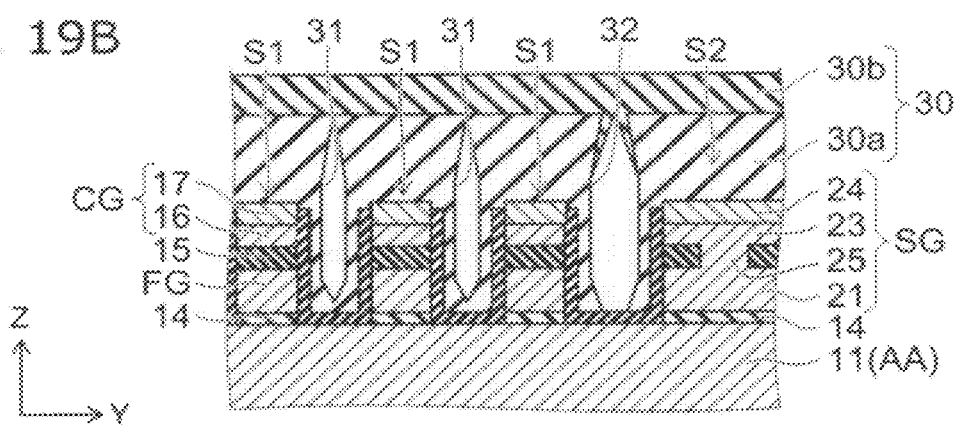
Figure 19C:
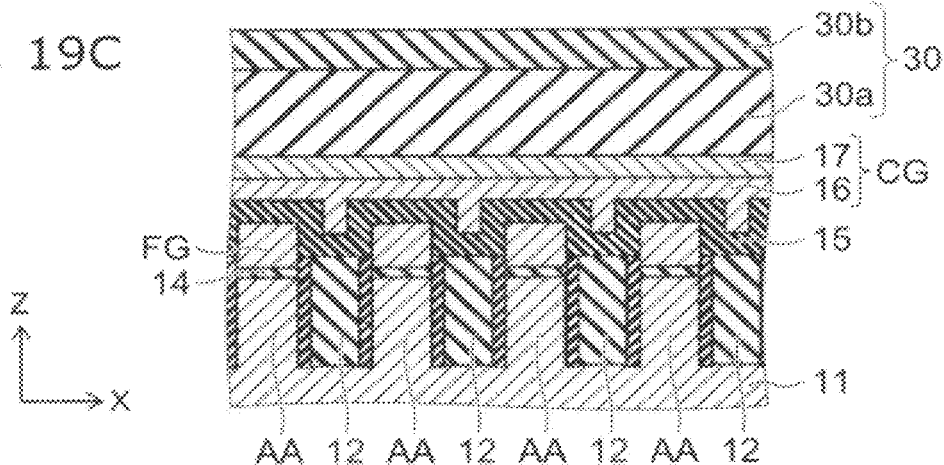

Next, as shown in FIGS. 19A to 19C, an insulating material such as silicon oxide is further deposited. This deposition is performed by a method such as the ALD (atomic layer deposition) method, which has higher buriability than the aforementioned deposition of the insulating material shown in FIGS. 18A to 18C. Thus, an interlayer insulating film 30b is stacked on the interlayer insulating film 30a. Simultaneously, the insulating material penetrates into the void 32 and fills the lower portion of the void 32. As a result, the position of the lower end 32a of the void 32 is made higher than the position of the lower end 31a of the void 31. Subsequently, the upper end 32b of the void 32 is sealed with the interlayer insulating film 30b. The interlayer insulating films 30a and 30b constitute the interlayer insulating film 30 shown in FIGS. 1A to 1C. The subsequent process is similar to that of the above second embodiment.

The embodiment can also manufacture the semiconductor memory device 1 according to the above first embodiment. According to the embodiment, the deposition of the insulating material is performed in two steps. The buriability is made relatively lower in the first deposition, and relatively higher in the second deposition. Hence, the timing of sealing the upper end 31b of the void 31 and the timing of sealing the upper end 32b of the void 32 can be controlled more accurately. As a result, the position of the lower end 31a of the void 31 and the position of the lower end 32a of the void 32 can be controlled more accurately. The manufacturing method and the operation and effect of the embodiment other than the foregoing are similar to those of the above second embodiment.

The embodiments described above can realize a semiconductor memory device and a method for manufacturing the same capable of increasing the integration density of memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A semiconductor memory device comprising:
   a semiconductor substrate;
   a plurality of element isolations formed in an upper portion of the semiconductor substrate and partitioning the upper portion into a plurality of active areas extending in a first direction;
   a plurality of first stacked bodies provided on the semiconductor substrate and extending in a second direction crossing the first direction;
   a second stacked body provided on the semiconductor substrate, located outside a region populated with the plurality of first stacked bodies, and extending in the second direction; and
   an interlayer insulating film covering the first stacked bodies and the second stacked body,
   each of the first stacked bodies including:
   a first electrode provided above each of the active areas;
   an insulating film provided on the first electrode; and
   a second electrode provided on the insulating film and extending in the second direction,
   distance between each of the first stacked bodies and the second stacked body being longer than distance between adjacent ones of the first stacked bodies,
   a first void being formed in the interlayer insulating film between the first stacked bodies,
   a second void being formed in the interlayer insulating film between one of the first stacked bodies and the second stacked body, and
   a lower end of the second void being located above a lower end of the first void, wherein the lower end of the first void is located below an upper surface of the first electrode.

2. The device according to claim 1, wherein the lower end of the second void is located above an upper surface of the first electrode.

3. The device according to claim 1, wherein the lower end of the second void is located below a lower surface of the second electrode.

4. The device according to claim 1, wherein upper ends of the first and second voids are located above an upper surface of the second electrode.

5. The device according to claim 1, wherein
   the second stacked body includes:
   a first conductive portion provided on same level as the first electrode;
   a second conductive portion provided on same level as the second electrode;
   another insulating film provided on same level as the insulating film and including an opening; and
   a connecting member provided in the opening and connecting the second conductive portion to the first conductive portion.

6. The device according to claim 1, wherein no program voltage is applied to the second electrode of one of the plurality of first stacked bodies, the one of the plurality of first stacked bodies is located next to the second stacked body.

* * * * *